(12) United States Patent
Cheng

(10) Patent No.: US 7,209,858 B1
(45) Date of Patent: Apr. 24, 2007

(54) PRECISION POSITION DETERMINING METHOD

(75) Inventor: Chen-Hsiung Cheng, Westford, MA (US)

(73) Assignee: Matsushita Electric Industrial Co., Ltd, Osaka (JP)

( * ) Notice: Subject to any disclaimer, the term of this patent is extended or adjusted under 35 U.S.C. 154(b) by 0 days.

(21) Appl. No.: 11/240,756

(22) Filed: Sep. 30, 2005

(51) Int. Cl.
*G01B 3/22* (2006.01)
*G01B 5/20* (2006.01)
*G01B 7/28* (2006.01)

(52) U.S. Cl. .................. 702/167; 702/155; 702/158

(58) Field of Classification Search .............. 702/167, 702/155, 158
See application file for complete search history.

(56) References Cited

U.S. PATENT DOCUMENTS

| 5,831,181 | A | 11/1998 | Majumdar et al. |
| 6,181,097 | B1 | 1/2001 | Li et al. |
| 7,068,377 | B2 * | 6/2006 | Degertekin et al. ......... 356/511 |
| 2003/0047675 | A1 | 3/2003 | Proksch et al. |
| 2004/0072994 | A1 | 4/2004 | Herr et al. |
| 2005/0001579 | A1 | 1/2005 | Touzov |
| 2005/0004689 | A1 | 1/2005 | Shih et al. |

FOREIGN PATENT DOCUMENTS

| JP | 6-204118 | 7/1994 |
| JP | 2001-85501 | 3/2001 |
| JP | 2004-12244 | 1/2004 |

\* cited by examiner

*Primary Examiner*—John Barlow
*Assistant Examiner*—Sujoy Kundu
(74) *Attorney, Agent, or Firm*—RatnerPrestia

(57) ABSTRACT

A method for generating a surface profile of a microstructure. The profile is processed to determine positions of at least two edges and an approximate center point of the profiled surface. Segments of points on the determined profile are fit to a straight line centered at the approximate center point. A standard deviation of the fitted points is measured. The length and position of the segment are varied until a minimum standard deviation is determined and the process is repeated for segments having different lengths. The point is determined from the longest segment having a standard deviation approximately equal to the minimum standard deviation of all of the segment lengths.

18 Claims, 8 Drawing Sheets

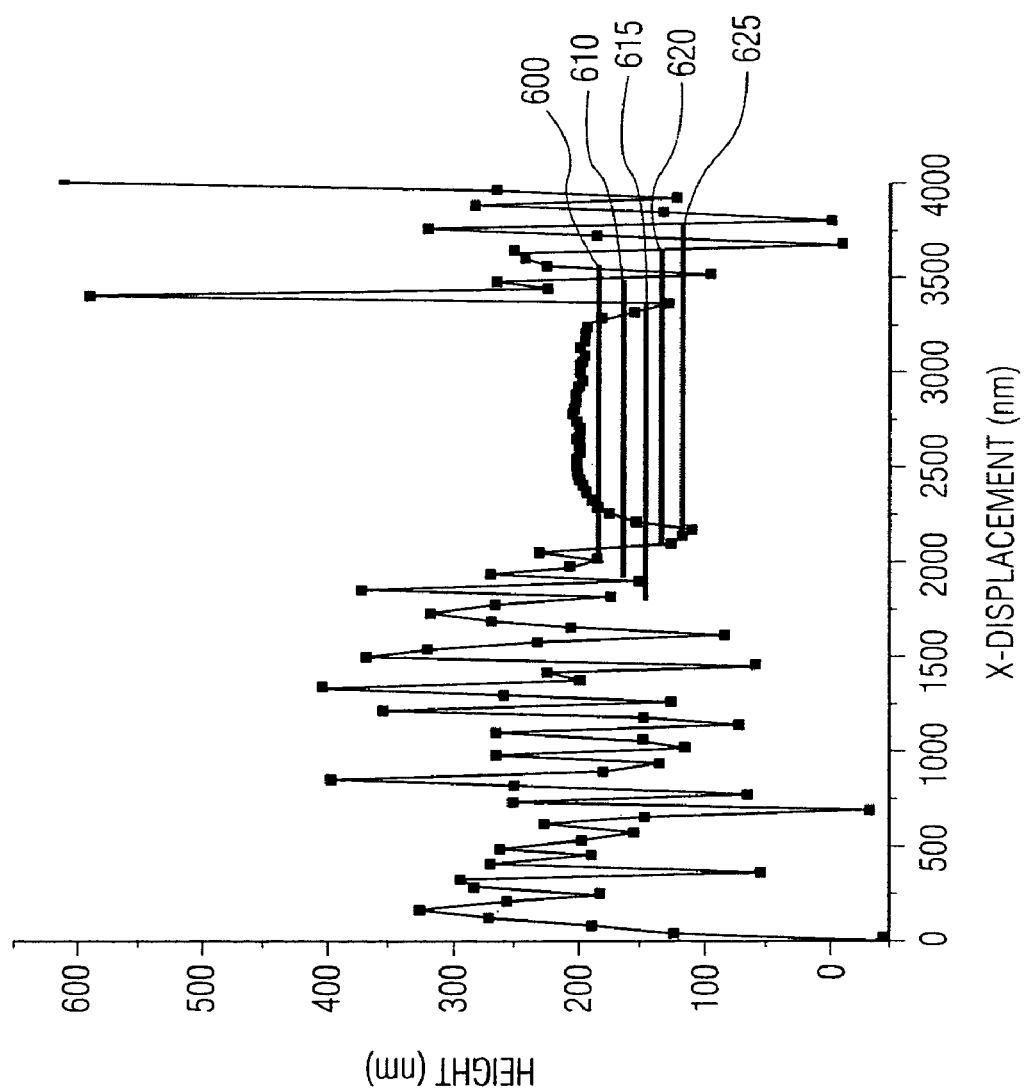

PRECISION POSITION DETERMINING METHOD

FIELD OF THE INVENTION

The present invention concerns a method for laser machining of submicron features on microstructures, including nanostructures. This method may also allow mass manufacturing, customization or repair of generic electronic and mechanical microstructures. More specifically it concerns the precision position locking of a micromachining tool.

BACKGROUND OF THE INVENTION

As products get smaller and smaller, there is increased demand for micro-electrical-mechanical systems (MEMS), micro-optical devices and photonic crystals. With this demand, there is an associated increased interest in micro- and nano-machining. Numerous applications exist for MEMS. As a breakthrough technology, allowing unparalleled synergy between previously unrelated fields such as biology and microelectronics, new MEMS applications are emerging at a rapid pace, expanding beyond those currently identified or known. Additional applications in quantum electric devices, micro-optical devices and photonic crystals are also emerging.

Here are a few applications of current interest:

Quantum Electrical Devices

Interest in ideas such as quantum computing have led to the development of devices requiring increasing smaller dimensions, such as cellular automata and coupled quantum dot technologies. Resonant tunneling devices such as resonant tunneling diodes, which may utilize quantum effects of transmission electrons to increase the efficiency of microwave circuits, require particularly fine features.

Micro-Optics

The application of micro-machining techniques to optics has led to numerous advances in optical fabrication such as gray scale technology. Gray scale technology allows for the creation of a wide variety of shapes allowing for the best optical performance achievable. Traditional binary optics rely on a "stair step" shaped approximation of the ideal surface shape. Gray scale can actually create that ideal shape. Curves, ramps, torroids, or any other shape is possible. Multi-function optics, microlens arrays, diffusers, beam splitters, and laser diode correctors may all benefit from the use of gray scale technology. These optical devices as well as others, including fine pitch gratings for shorter and shorter wavelength light, benefit from increased precision available using micro-machining. Optical MEMS devices including beam shapers, continuous membrane deformable mirrors, moving mirrors for tunable lasers, and scanning two axis tilt mirrors have also emerged due to progress in micro-machining technology.

Photonic Crystals

Photonic crystals represent an artificial form of optical material that may be used to create optical devices with unique properties. Photonic crystals have many optical properties that are analogous to the electrical properties of semiconductor crystals and, thus, may allow the development of optical circuitry similar to present electrical semiconductor circuitry. The feature sizes used to form photonic crystals and the precise alignment requirements of these features complicate manufacture of these materials. Improved alignment techniques and reduced minimum feature size capabilities for micro-machining systems may lead to further developments in this area.

Biotechnology

MEMS technology has enabling new discoveries in science and engineering such as: polymerase chain reaction (PCR) microsystems for DNA amplification and identification; micro-machined scanning tunneling microscope (STM) probe tips; biochips for detection of hazardous chemical and biological agents; and microsystems for high-throughput drug screening and selection.

Communications

In addition to advances that may result from the use of resonant tunneling devices, high frequency circuits may benefit considerably from the advent of RF-MEMS technology. Electrical components such as inductors and tunable capacitors made using MEMS technology may perform significantly better than their present integrated circuit counterparts. With the integration of such components, the performance of communication circuits may be improved, while the total circuit area, power consumption and cost may be reduced. In addition, a MEMS mechanical switch, as developed by several research groups, may be a key component with huge potential in various microwave circuits. The demonstrated samples of MEMS mechanical switches have quality factors much higher than anything previously available. Reliability, precise tuning, and packaging of RF-MEMS components are to be critical issues that need to be solved before they receive wider acceptance by the market.

Advances in micro-optics and the introduction of new optical devices using photonic crystals may also benefit communications technology.

Accelerometers

MEMS accelerometers are quickly replacing conventional accelerometers for crash air-bag deployment systems in automobiles. The conventional approach uses several bulky accelerometers made of discrete components mounted in the front of the car with separate electronics near the air-bag. MEMS technology has made it possible to integrate the accelerometer and electronics onto a single silicon chip at a cost of ⅕ to ⅒ of the cost of the conventional approach. These MEMS accelerometers are much smaller, more functional, lighter, and more reliable as well, compared to the conventional macro-scale accelerometer elements.

Micro-Circuitry

Reducing the size of electronic circuits is another area in which MEMS technology may affect many fields. As the density of components and connections increases in these microcircuits, the processing tolerances decrease. One challenge in producing micro-circuitry is preventing shorts between components and nano-wires which are located ever closer together. Yields may be significantly increased by micromachining methods with the capability to repair these defects.

Micromachining of submicron features has been a domain predominated by electron-beam, ultraviolet beam, and X-ray lithographic machines, as well as focused ion beam machines. These high-cost techniques usually require stringent environmental conditions, such as high vacuum or clean room condition. All the lithographic methods require a series of complicated procedures, which involve generating multiple masks and using photoresist.

If a beam processing technique is used, the beam is desirably directed accurately at the desired location with a high degree of precision for proper processing. Only four currently available technologies (laser direct writing, focused ion beam writing, micro electric discharge machine, and photochemical etching) have this potential capability. Other techniques (for example ion beam milling) are only desirable for flat wafer processing. However, direct laser writing has the additional advantage of operation in ambient air. Still forming submicron features with a laser beam smaller the wavelength of the laser is a difficult issue.

Laser machining of surfaces using the near-field radiation of a near-field scanning optical microscope (NSOM), sometimes known as a scanning near-field optical microscope, has been proposed as a means of laser machining submicron features. One potential method for micromachining surfaces in this way is disclosed in Japanese Patent Application 2000-51975, LASER MACHINING APPARATUS AND ITS METHOD AND AN OPTICAL ELEMENT MACHINED BY USING SAME, to H. Owari, et al. Owari, et al. disclose using light from a short-wavelength ultraviolet laser that is transmitted through the probe of an atomic force microscope to laser machine an optical grating.

In order to fully realize these results of micro- and nanomachining there is a need for a method capable of positioning a machine tool with a precision in the nanometer range and locking the position within the subnanometer range.

Currently, no technique is known to be able to achieve better than 10-nm positioning precision on a performed substrate nondestructively. Although other techniques such as a UV optical stepper can achieve such precision on a blank substrate, those techniques cannot be applied to a preformed structure due to lacking precision surface topology feedback. In general the lateral precision of 50-nm could be achieved by optical imaging method. The charged beam apparatus can achieve very good precision but it intends to be destructive.

SUMMARY OF THE INVENTION

The present invention is embodied in a method for locating a point on a surface of a microstructure with a precision and stability approaching 10 nm. The invention also involves micromachining with the same positional precision by positioning a machine tool using the method of invention.

The exemplary method generates a surface profile of the microstructure and processes the profile to determine positions of at least two edges and an approximate center point of the profiled surface. The method then fits segments of points on the determined profile to a straight line centered at the approximate center point and measures a standard deviation of the fitted points. The length and position of the segment are varied until a minimum standard deviation is determined. The point is determined from the longest segment having a standard deviation approximately equal to the minimum standard deviation.

BRIEF DESCRIPTION OF THE DRAWINGS

The invention is best understood from the following detailed description when read in connection with the accompanying drawings. It is emphasized that, according to common practice, the various features of the drawings are not to scale. On the contrary, the dimensions of the various features are arbitrarily expanded or reduced for clarity. Included in the drawing are the following figures:

FIG. 6a is a profile graph that shows, schematically, the displacement of a line segment of constant length with respect to the profile.

DETAILED DESCRIPTION OF THE INVENTION

Figure 1:
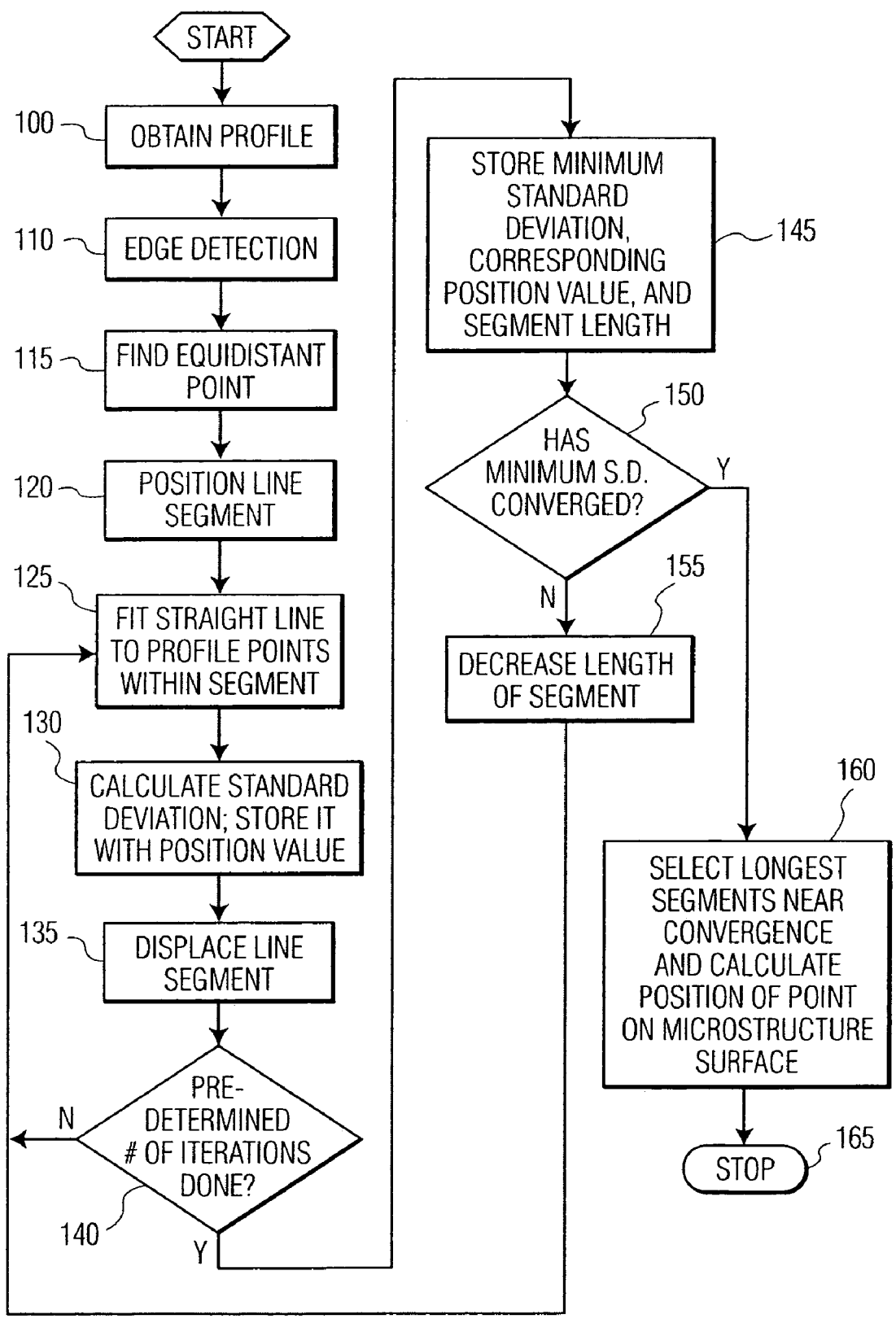
FIG. 1 is a flow chart illustrating an embodiment of the inventive method for locating a point on the surface of a microstructure.

FIG. 1 illustrates an embodiment of a method for locating a point on a surface of a microstructure with a positioning accuracy and stability potentially less than 10 nm. The term microstructure is to be understood as a physical structure having at least one feature smaller than 1 micrometer.

Figure 2:
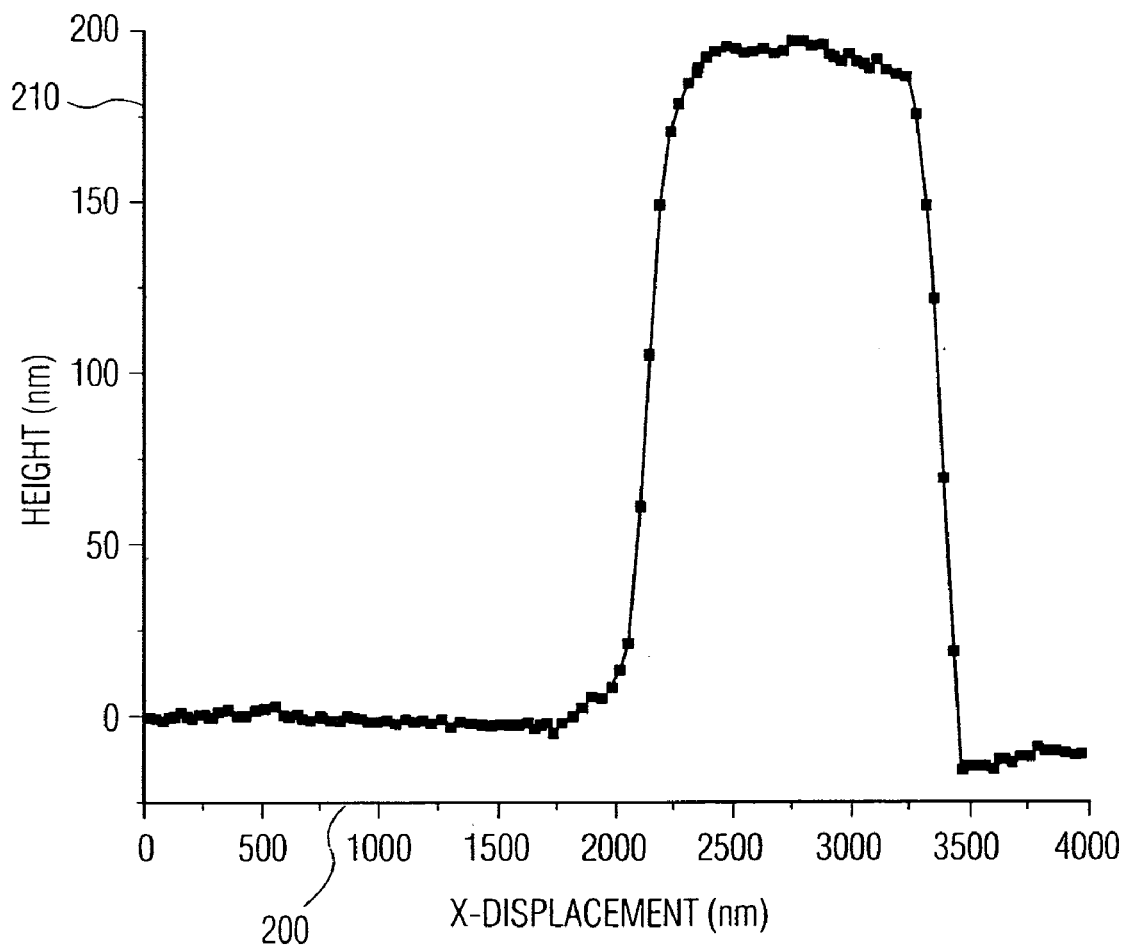
FIG. 2 is a graph of height versus displacement that shows an example of a profile of the microstructure used by the exemplary method.

To start, a profile of the microstructure is measured 100 to obtain respective positions of at least two edges of the microstructure surface. The profile is comprised of position points, designating lateral positions on the surface, and profile points, giving the height or depth of the surface at each position point. One profile point is associated with each position point. The profile may be obtained by any method with sufficiently small spatial resolution, such as an atomic force microscope (AFM), a near-field scanning optical microscope (NSOM), an NSOM probe operating as an AFM probe, a scanning tunneling microscope (STM), an interferometer, a white light interferometer, a stereo microscope, or a confocal microscope. FIG. 2 shows an example of a profile, obtained with an NSOM. Position point values, in nm are indicated on the x-axis 200, while profile point values, in nm, are indicated on the y-axis 210. As can be seen in the example, the profile defines a top surface 212 and two side surfaces 214 and 216 of the microstructure. In one embodiment of the invention, the exemplary method is used to accurately determine a center point of the top surface 212 of the microstructure.

Figure 3:
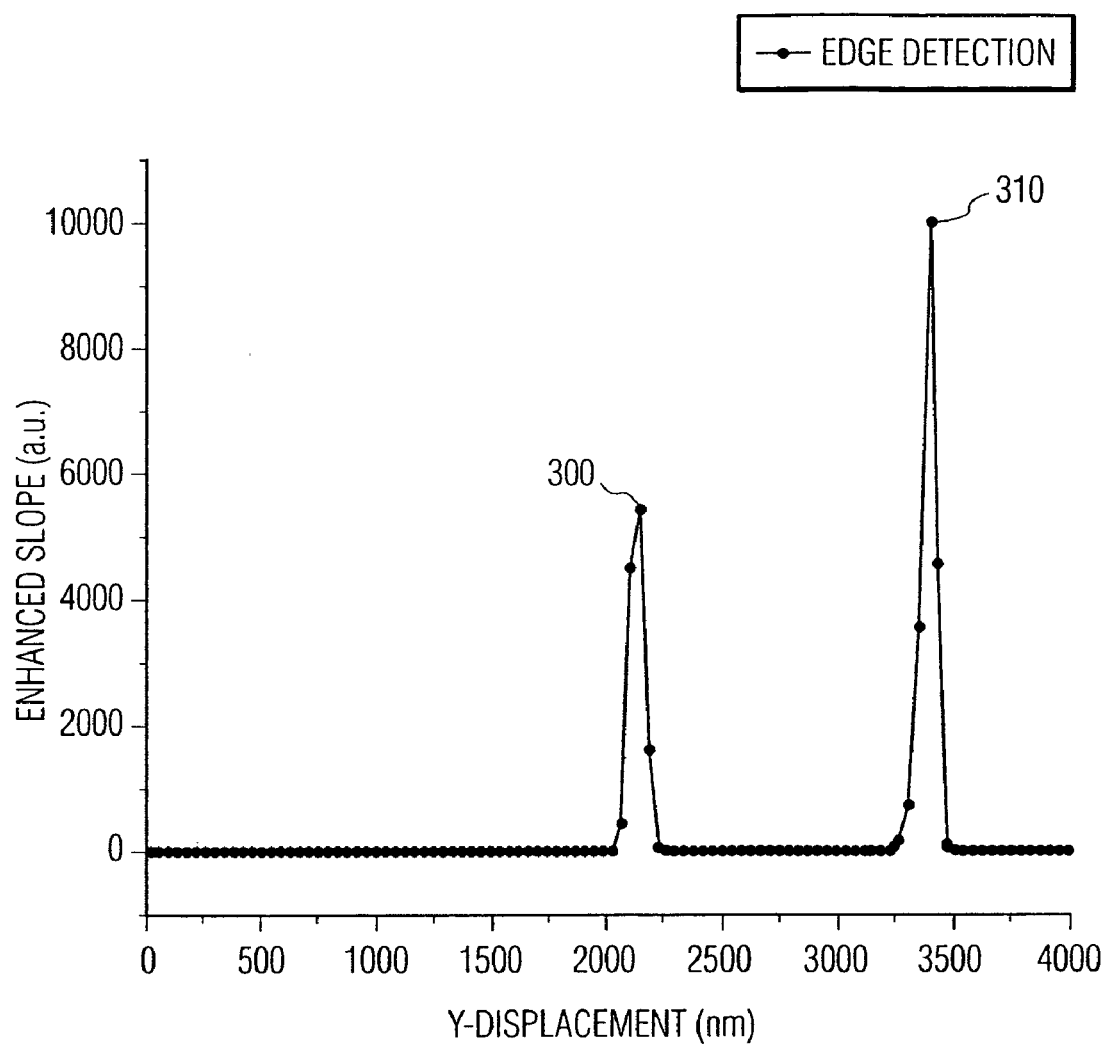
FIG. 3 is a graph of enhanced slope versus displacement that shows an absolute value of a derivative of the profile shown in FIG. 2 after processing, used for locating edges of the profiled surface of the microstructure.

From the profile data, positions of edges in the microstructure are determined, 110. The edges may be found using any standard edge detection technique known in the art, such as using of derivatives of the profile data or convolutions of the profile data with edge detection functions (e.g. step functions, impulse functions, etc.). For example, by calculating derivatives of the profile at a plurality of position points, edges may be found with reasonable accuracy. This is because the values of the profile points change relatively rapidly in the neighborhood of edges. Thus, significant changes in the magnitude of the derivative of the profile point may indicate an edge. These derivatives may be processed to further enhance the edges. One way to do this is to calculate the absolute value of the derivative, calculate the numerical average of the derivatives and subtract this average from each derivative value to obtain new derivative values. These new values are then normalized so that the highest value has the value 1. The normalized values are then multiplied by a factor greater than 1, and these values are then raised to a power greater than 1. The overall effect is to amplify the derivative values only in the immediate areas of edges, thus more precisely determining the position of edges. FIG. 3 shows an example of edge detection using this method, with single points 300, 310 identified with edges of the microstructure.

NSOM's use many of the same principles as atomic force microscopes (AFM's) to accurately profile surfaces. Laser micromachining of these surfaces using near-field radiation from an NSOM probe tip may provide a number of advantages compared to using non-near-field radiation and free space optics. The advantages may include precise positioning control of the NSOM probe tip and a reduced minimum feature size. The precise motion stages used in NSOM devices may be used to provide precise horizontal and vertical positioning control. Additionally, the ability of an NSOM to profile a surface allows for the accurate vertical positioning of the probe tip desired to couple significant near-field radiation to the surface.

The minimal feature size that may be machined with an exemplary NSOM laser machining system of the present invention using near-field radiation is determined by the size of the NSOM probe tip, rather than by the wavelength of the laser light used to generate the near-field radiation. This may allow a laser machining apparatus, such as that disclosed by Owari et al., to machine areas on a surface, which are smaller than the diffraction limited spot size of a free space laser beam from the same laser source. The wavelength of the laser is still an issue, though, because it affects the efficiency with which the light may be coupled into the near-field through the NSOM probe tip. Thus, Owari et al. disclose the use of short wavelength UV lasers with wavelengths approximately equal to the diameters of the circular cross-sections of their NSOM probe tips.

Returning to FIG. 1, the next step in the illustrated embodiment of the method is locating a point approximately equidistant from the edges 115. This point serves as a first approximation to the location of the final point determined by this embodiment of the method of the invention. If only two edges are used, this is the midpoint between the edges. From the locations the edges an equidistant point may be easily calculated.

Next a line segment is defined 120 containing a plurality of the position points. The line segment has a center point and a length and the segment is positioned with its center point coinciding with the point approximately equidistant from the edges. The starting segment length may be 10 or 20 position points larger than the length defined by the edge locations. In the exemplary embodiment of the invention, a position represents a finest resolution step that may be achieved by the NSOM.

The next step is fitting a straight line 125 to profile points associated with selected position points contained within the line segment. A standard way to do this by linear fitting using a least-square routine to calculate both the best fit slope and also a standard deviation of the actual profile points 130. Equivalently, the standard deviation may be calculated by calculating, for each selected position point a difference between the associated profile point and the associated value of the fitted straight line and calculating a mean and a standard deviation of the differences. The standard deviation is stored along with the corresponding position value indicating the position of the segment.

Next the line segment is displaced 135 along its own length to a new position, relative to the position points of the profile. This displacement is carried out a predetermined number of times 140, perhaps in both directions relative to the initial position. As an example the segment may be shifted 5 position points to the left and 5 position points to the right relative to the initial position of the segment. FIG. 6A illustrates schematically a line segment 600 in the initial position and four displaced positions 610, 615, 620, 625. The length of these segments is constant and the segments are displaced vertically from one another for clarity; in reality they coincide, as described above.

At each displacement, a mean and standard deviation for all of the profile points corresponding to the position points contained within the line segment are calculated as described above and the standard deviations are stored, each with its corresponding position value defining the position of the line segment. A minimum standard deviation in this plurality of values is then found 145 and stored separately with the corresponding line segment position value and the length of the line segment. The segment is displaced to the position corresponding to this minimum standard deviation.

The length of the segment is then decreased 155. The amount of decrease may be one position point. With this shorter segment a fit to a straight line 125 is done as described above for the position points contained in the shorter segment. The shorter segment is displaced a predetermined number of times 135, 140 and a new minimum standard deviation is extracted 145 and stored along with the position and length of the corresponding line segment. After each extraction of the minimum standard deviation this minimum value is checked for convergence to a constant value 150. The iteration continues until convergence.

Once convergence occurs, one or more segments are selected 160 from storage which are the segments of greatest length having corresponding minimum standard deviation values approximately equal to the convergence value of the minimum standard deviation. From the position values of these segments, a position value for the target point on the surface of the microstructure, such as a midpoint between two edges, is calculated 160. For example, the target position may be calculated from the single longest segment having a standard deviation approximately equal to the converged standard deviation value or as the average of position values of midpoints of a few selected segments having lengths that are one position-point less than and/or greater than this longest segment. These selected segments may be, for example the three longest segments in the convergence sequence that have converged to the standard deviation value within a predetermined tolerance. At this point the method stops 165.

Figure 6B:
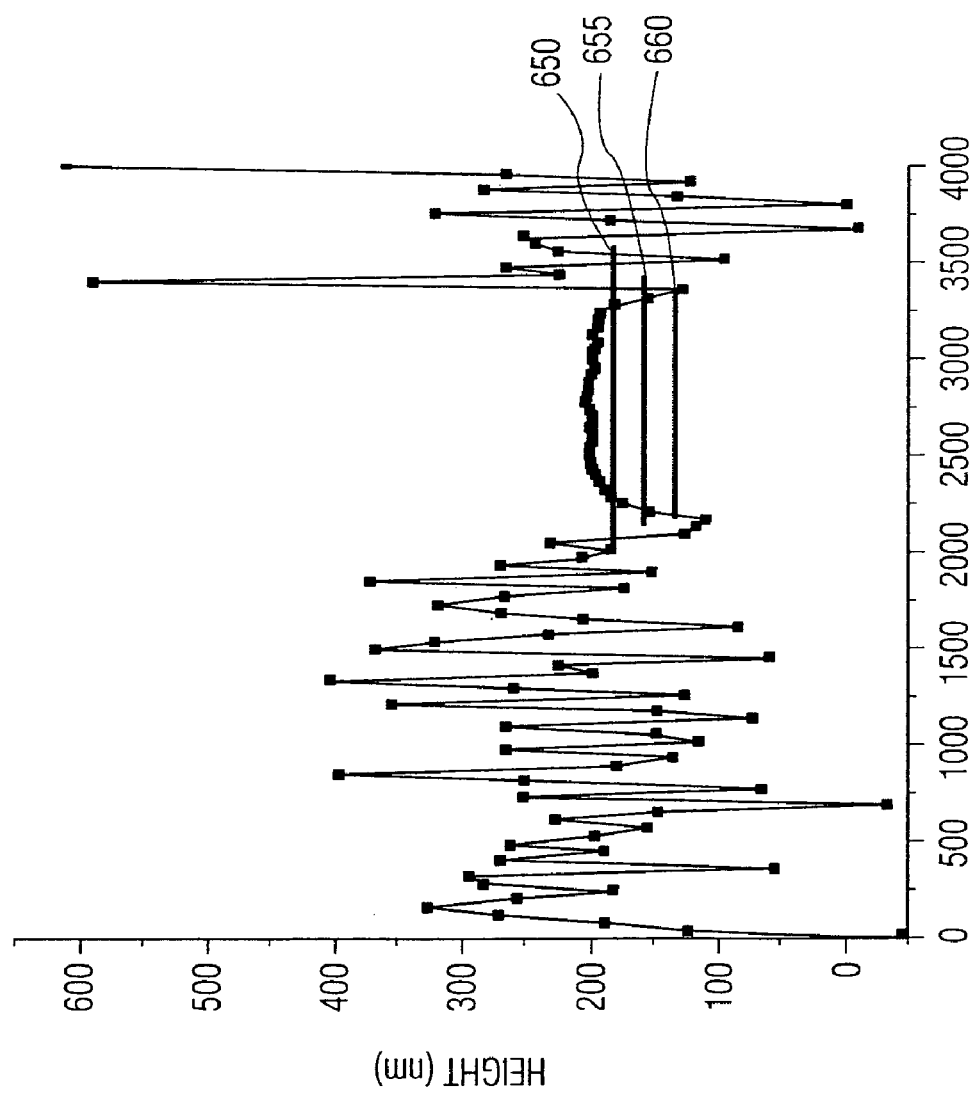
FIG. 6b is a profile graph that shows, schematically, the shortening of a line segment to the longest length resulting in a minimum standard deviation.

FIG. 6B illustrates schematically the shortening of the line segment. Segments 650, 655, and 660 are segments resulting from consecutive iterations. Segment 660 may be regarded as nearly at convergence of the minimum standard deviation. As in FIG. 6A, the segments are displaced vertically from one another for clarity only; in reality each segment is mapped into corresponding values of the profile, as described above.

Figure 5:
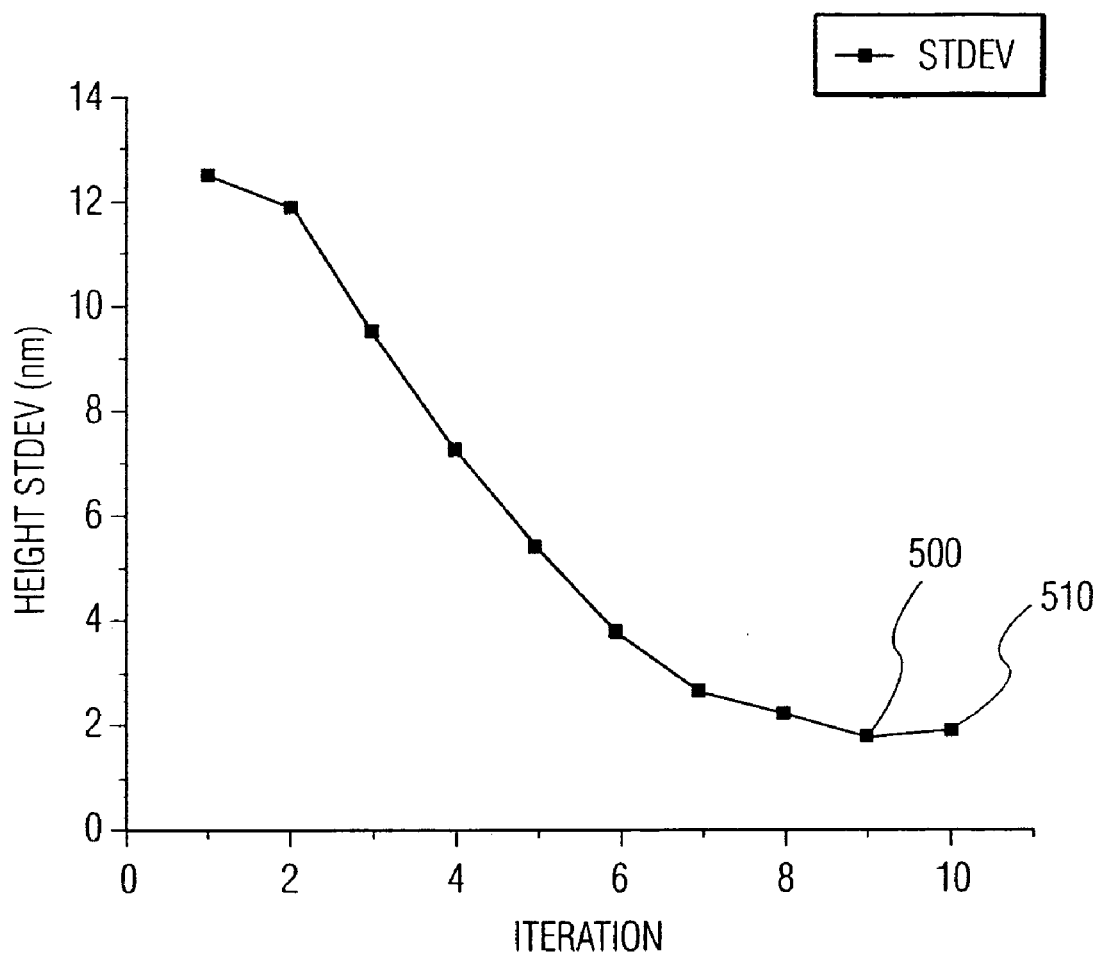
FIG. 5 is a graph of height standard deviation versus displacement that shows convergence to a minimum standard deviation as the method goes through successive iterations.

The convergence of the minimum standard deviation values may be detected by looking for an increase in the minimum standard deviation value over this value in a previous iteration. FIG. 5 shows an example of this phenomenon, where the standard deviation reaches a minimum value at the penultimate iteration 500 but then rises again at the last iteration 510. In this case the minimum point 500 could be regarded as the point of convergence. This rise in standard deviation may happen because the line segment becomes entirely contained between the edges of the structure such as the segment 660 in FIG. 6B. In this region, the profile points may vary randomly. In that case, decreasing the number of samples used in the standard deviation calculation, as will result from shortening the line segment, may increase the standard deviation value because the uncertainty in a standard deviation is inversely proportional to the square root of the number of samples.

Figure 7:
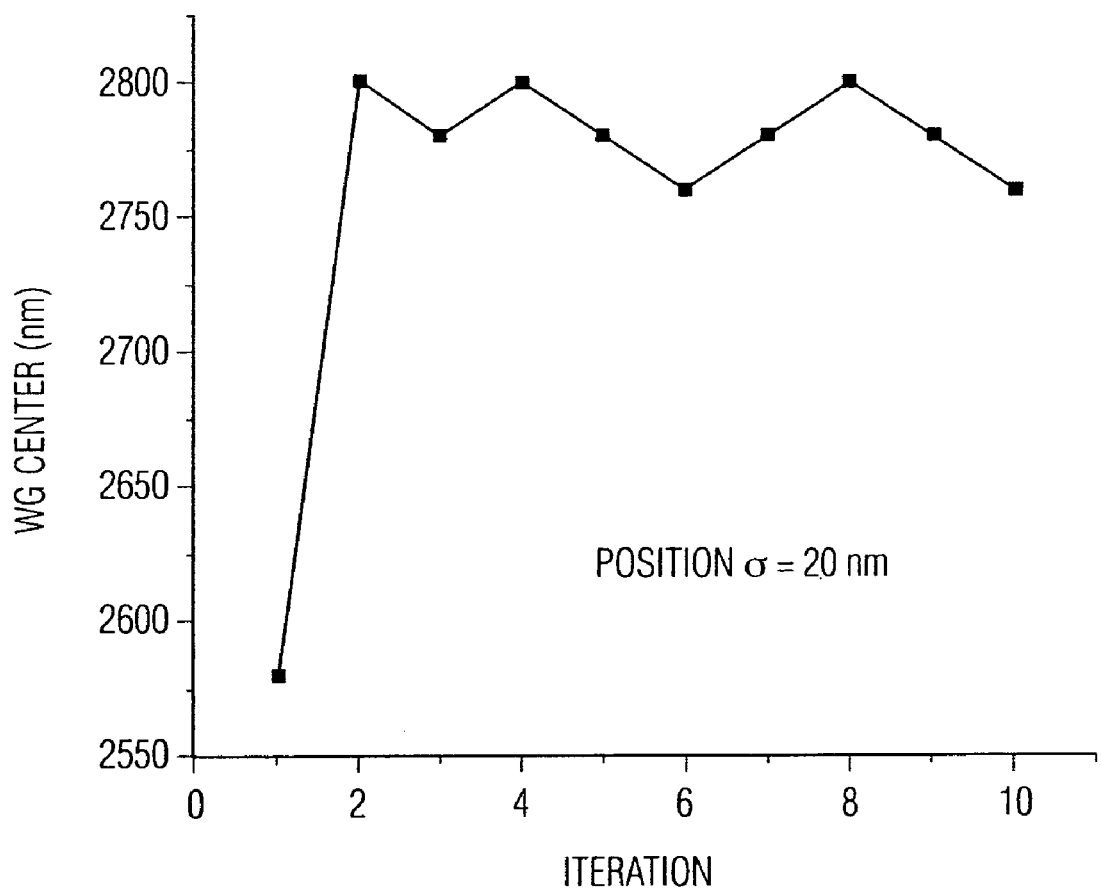
FIG. 7 is a graph showing the determined center point of the microstructure for successive iterations of the exemplary method.

FIG. 7 shows how the target point converges using the method described here. In this example, it is evident that the convergence of the target point reaches its best level very quickly and the target point variation does not improve any more after second iteration even though the standard deviation seems to continue dropping as shown in FIG. 5. This is an indication that the final result is limited by the noise in the original data, not by the technique itself. The 20-nm standard deviation of the target point in FIG. 7 is the standard deviation for one measurement or one scan. In order to get the more meaningful standard deviation, multiple measurements are generally desirable. Due to the small thermal drift, however, it is not possible to obtain any better standard deviation in multiple scans than in a single scan. Variation of 5.8-nm with refined data acquisition procedures and better samples with much less noise has been achieved.

In an alternative embodiment, a fit to a straight line 125 is not used. Instead, the derivative values of the profile are used. First the derivative values of the profile at various position points are determined, edge positions and equidistant point are determined as described above and a line segment is defined as above. In each iteration, however, derivatives associated with selected position points contained within the segment are obtained and the mean and standard deviation of the derivatives are calculated. The standard deviation is stored with the corresponding position value indicating the position of the segment. The iteration then proceeds as before using this derivative standard deviation instead of a standard deviation derived from a fitted straight line, as in the first embodiment.

Figure 4:
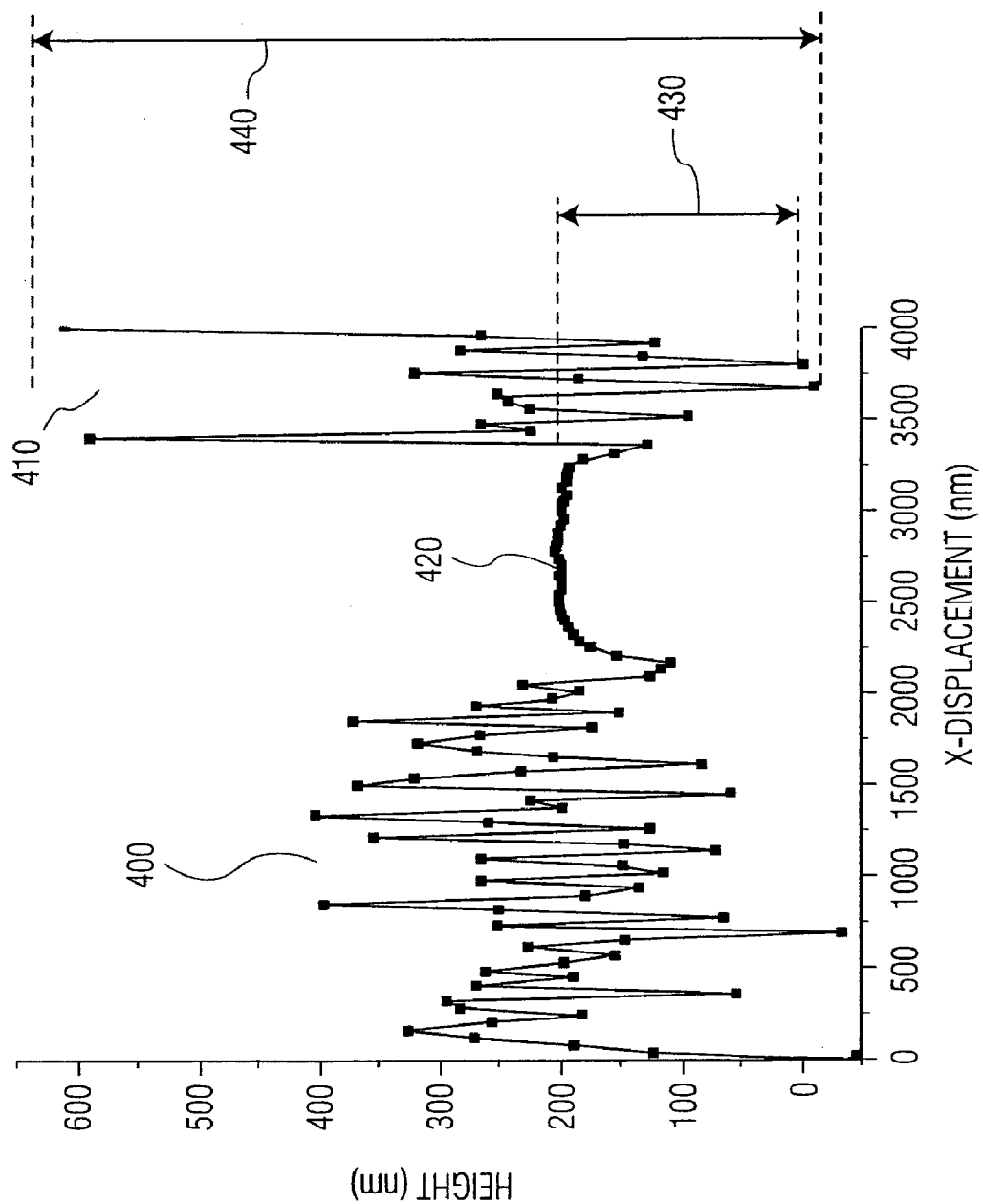
FIG. 4 shows the profile of FIG. 2 with random numbers added to the profile points lying outside a region bounded by edges of a structure.

As an additional aid to convergence in any embodiment, before the iteration begins, random numbers may be added to the values of the profile points lying outside a region bounded by the determined edges of the structure in order to increase the standard deviation for line segments extending into this region. It may be desirable for these random numbers to vary with an amplitude larger than fluctuations in the obtained surface profile and to include an offset substantially equal in magnitude to the obtained sizes of the side surfaces. FIG. 4 illustrates an exemplary resulting profile. The standard deviation of points lying outside the edges in regions 400 and 410 is made to be significantly greater than that actually occurring within the edges in region 420420. Also indicated are the approximate offset (430) and amplitude of variation (440) of the random numbers added to the points in regions 400 and 410.

Once a target point is determined with the exemplary method described in exemplary embodiments of the present invention, additional points on a microstructure may be located using the target point as a reference point and repositioning a probe or machine tool as desired relative to this reference point. This may desirably be accomplished by moving the probe or machine tool a precise distance in a precise direction from the target point. The positions of the additional points may thus be determined with a precision nearly the same as that of the position of the target point.

Once a target point is determined using the method described here, micromachining can be carried out with positioning accuracy provided by the method. A machine tool may be positioned using an embodiment of the invention and then activated to produce a machined structure. The machine tool may use a laser for ablation, capable of creating structures of sizes less than a wavelength of the laser light. The laser machining may be accomplished with any device capable of nanometer special resolution, such as an NSOM probe, an AFM probe perhaps acting as an antenna for the laser light to concentrate the light on a workpiece surface, an NSOM probe capable of operation as an AFM probe, perhaps by virtue of having a metal cladding, or an NSOM probe and an AFM probe coupled together. An exemplary method four using an AFM prove as an antenna for laser light is described in an article by A. Chimmalgi et al. entitled "Femtosecond Laser Aperturless Near-Field Nanomachining of Metals Assisted by Scanning Probe Microscopy" Appl. Phys. Lett., Vol. 82, No. 8, 24 Feb. 2003.

One exemplary use of the exemplary method is to tune a photonic crystal. As described above, a photonic crystal may be formed by making regularly spaced apertures in a waveguide structure. Properties of the photonic crystal are determined by imperfections in the spacing or size of the apertures. One exemplary photonic crystal may include a first set of five regularly spaced apertures in a Si waveguide, separated by a portion of the waveguide without any aperture from a second set of five regularly spaced apertures that mirrors the first set. This structure may be tuned by partially or completely filling one of the apertures, by enlarging one of the apertures or by forming a new aperture in the space separating the first and second sets of apertures. The exemplary method is useful for this last technique. It allows the accurate determination of the center line of waveguide. If the method is applied both to the length and width of the waveguide, it allows and accurate determination of the center point on the waveguide and also accurate positioning of an NSOM or AFM tip for laser machining an aperture at that center point. The exemplary method, however, is not limited to determining the center position. The NSOM or AFM may be moved to any position along the determined line. Thus, the exemplary embodiment of the invention may be used to accurately machine a photonic crystal by establishing a center line along the length of the waveguide and positioning the NSOM or AFM at intervals along the center line in order to machine apertures for any desired photonic crystal. As described above, the exemplary method may be used to locate points in two-dimensions. Thus, this method is also applicable to two-dimensional photonic crystal structures.

In some applications it may be desirable to disable the vertical position feedback control of the machine tool prior to activating it. This has been found to decrease vertical position fluctuations of the tool and decreasing the harmful effects of recoil during laser ablation.

In an exemplary system, an ultrafast laser source may desirably include any type of solid state gain medium typically used for ultrafast laser machining applications, such as: Cr:YAG (peak fundamental wavelength, $\lambda_f$=1520 nm); Cr:Forsterite ($\lambda_f$=1230–1270 nm); Nd:YAG and Nd:YVO4 ($\lambda_f$=1064 nm); Nd:GdVO4 ($\lambda_f$=1063 nm); Nd:YLF ($\lambda_f$=1047 nm and 1053 nm); Nd:glass ($\lambda_f$=1047–1087 nm); Yb:YAG ($\lambda_f$=1030 nm); Cr:LiSAF ($\lambda_f$=826–876 nm); Ti:Sapphire ($\lambda_f$=760–820 nm); and Pr:YLF ($\lambda_f$=612 nm). These solid state gain media may be pumped using standard optical pumping systems such as erbium doped fiber lasers and diode lasers, the output pulses of which may be directly coupled into the solid state gain medium or may undergo harmonic generation before being used to pump the solid state gain medium. The solid state gain medium (media) may be configured to operate as one or more of: a laser oscillator; a single pass amplifier; and/or a multiple pass amplifier. This element also includes optics to substantially collimate the laser light. Ultrafast laser source produces pulses of laser light, which have a duration of less than about 1ns. These pulses may desirably have durations of less than about 20 ps, and in many cases their durations may be less than 200 fs. The pulses of laser light produced by ultrafast laser source may desirably be nearly Fourier-transform limited. An additional, non-solid state, single or multiple pass amplifier such as a XeCl, KrF, ArF, or $F_2$ excimer amplifier (not shown) may be included to increase the output power of ultrafast laser source. Alternatively, ultrafast laser source 100 may include an ultrafast excimer laser system (e.g. XeCl, $\lambda_f$=308 nm; KrF, $\lambda_f$=248 nm; ArF, $\lambda_f$=193 nm; or $F_2$, $\lambda_f$=157 nm) or an ultrafast dye laser system (e.g. 7-diethylamino-4-methylcoumarin, $\lambda_f$=435–500 nm; benzoic acid, 2-[6-(ethylamino)-3-(ethylimino)-2,7-dimethyl-3H-xanthen-9-yl]-ethyl ester, monohydrochloride, $\lambda_f$=555–625 nm; 4-dicyanmethylene-2-methyl-6-(p-dimethylaminostyryl)-4H-pyran, $\lambda_f$=598–710 nm; or 2-(6-(4-dimethylaminophenyl)-2,4-neopentylene-1,3,5-hexatrienyl)-3-methylbenzothiazolium perchlorate, $\lambda_f$=785–900 nm).

It may be desirable for ultrafast laser source to have a peak wavelength of less than approximately 400 nm. A harmonic generation crystal may be used within this component to reduce the peak wavelength of the pulses of laser light. Desirably, a frequency-doubled, 150 fs Ti:Sapphire laser (for example a Clark MXR CPA2000) may be used as ultrafast laser source.

Although the invention is illustrated and described herein with reference to specific embodiments, the invention is not intended to be limited to the details shown. Rather, various modifications may be made in the details within the scope and range of equivalents of the claims and without departing from the invention.

What is claimed is:

1. A method for locating a point on a surface of a microstructure comprising the steps of:
   (a) obtaining a surface profile of the microstructure the microstructure having a top surface and at least two side surfaces;
   (b) processing the profile to determine respective positions of the at least two side surfaces and an approximate center point of the profiled surface;
   (c) fitting line segments of points on the determined profile to a straight line centered at the approximate center point and having a predetermined segment length greater than a distance between the at least two side surfaces;
   (d) measuring a standard deviation of the fitted line segments of points from the straight line;
   (e) storing the fitted line segment and the standard deviation of the fitted line segment of points from the straight line;
   (f) varying the line segment in position while repeating steps (d) and (e) until a minimum standard deviation is determined and recording the minimum standard deviation as the standard deviation for the segment length and the line segment having the minimum standard deviation as the centered line segment for the segment length;
   (g) selecting a line segment having a shorter length and repeating steps (c) through (f) until the minimum standard deviation converges; and
   (h) selecting a longest one of the stored centered line segments having a standard deviation approximately equal to the converged minimum standard deviation as the segment defining a line extending across the top surface of the microstructure; whereby the point on the microstructure is defined relative to the defined line.

2. The method of claim 1, wherein step of selecting the longest stored centered line segment having the standard deviation approximately equal to the minimum standard deviation includes the steps of selecting a plurality of stored centered line segments having respective standard deviations that are approximately equal to the converged minimum standard deviation and calculating an average of the plurality of stored centered line segments to define the line extending across the top surface of the microstructure.

3. The method of claim 1, wherein convergence is indicated by an increase in the value of the minimum standard deviation calculated in step (f) over the value of the minimum standard deviation calculated in one or more previous instances of step (f).

4. The method of claim 1, wherein the profile is obtained using at least one of:
   an atomic force microscope (AFM),
   a near-field scanning optical microscope (NSOM),
   an NSOM probe operating as an AFM probe,
   a scanning tunneling microscope (STM),
   an interferometer,
   a white light interferometer,
   a stereo microscope, or
   a confocal microscope.

5. A method according to claim 1, wherein the step of processing the profile to determine respective positions of the at least two side surfaces includes at least one of:
   determining a derivative of the profile; or
   convolving the profile with at least one edge detection function.

6. A method according to claim 1, wherein the step of processing the profile to determine respective positions of the at least two side surfaces includes the step of calculating an absolute value of a derivative of the profile.

7. The method of claim 6, further comprising the steps of:
   (a) calculating a numerical average of the derivative at each of a plurality of position points along the calculated derivative and subtracting the average from each value of the derivative at each of the position points to yield new derivative values,
   (b) normalizing the new derivative values such that the highest new derivative value has a value of 1,
   (k) multiplying the normalized values by a factor greater than 1, and
   (l) raising the values computed in step (k) to a power greater than 1.

8. The method of claim 1 further comprising the step of adding random numbers to points of the profile lying outside of the two side surfaces to increase the standard deviation for the line segments extending beyond the side surfaces, the random numbers having an offset substantially equal in magnitude to sizes of the at least two side surfaces, and an amplitude of variation larger than fluctuations in the obtained surface profile.

9. A method for micromachining one or more structures on a top surface of a microstructure, the structures being positioned with positional precision less than 50 nm, the method comprising the steps of determining a position on the microstructure using the method of claim 1;

positioning a machining tool to the determined center position, and activating the tool to create the one or more structures.

10. The method of claim 9, wherein the machine tool comprises:

a near-field scanning optical microscope (NSOM) probe, an atomic force microscope (AFM) probe configured to act as an antenna for a laser, an NSOM probe capable of operation as an AFM probe, or an NSOM probe and an AFM probe coupled together.

11. The method of claim 9 wherein the machining tool includes an AFM probe and the method further comprises the step of disabling vertical position feedback control of the machine tool prior to activating, to decrease vertical position fluctuations resulting from recoil of the tool during machining.

12. The method of claim 1 further comprising the step of:

i) locating additional points on the top surface of the microstructure using the point defined in step (h) on the top surface of the microstructure as a reference point.

13. A method for locating a point on a surface of a microstructure, comprising the steps of:

(a) obtaining a surface profile of the microstructure the microstructure having a top surface and at least two side surfaces;

(b) generating an absolute value of a derivative of the profile to determine respective positions of the at least two side surfaces and an approximate center point of the profiled surface;

(c) selecting points of the calculated derivative of the profile on a straight line centered at the approximate center point and having a predetermined segment length greater than a distance between the at least two side surfaces;

(d) measuring a mean value and a standard deviation of the selected points;

(e) storing the straight line the mean value of the selected points, and the standard deviation of the selected points;

(f) varying the straight line in position while repeating steps (d) and (e) until a minimum standard deviation is determined and recording the minimum standard deviation as the standard deviation for the segment length and the straight line having the minimum standard deviation as the centered line segment for the segment length;

(g) selecting a straight line having a shorter length and repeating steps (c) through (f) until the minimum standard deviation converges; and (h) selecting a longest centered line segment having a standard deviation approximately equal to the converged minimum standard deviation as the line segment defining a line extending across the top surface of the microstructure; whereby the point on the microstructure is defined relative to the defined line.

14. The method of claim 13, wherein step of selecting the longest centered line segment having the standard deviation approximately equal to the minimum standard deviation includes the steps of selecting a plurality of centered line segments having respective standard deviations that are approximately equal to the converged minimum standard deviation and calculating an average of the plurality of centered line segments to define the line extending across the top surface of the microstructure.

15. The method of claim 13, wherein convergence is indicated by an increase in the value of the minimum standard deviation calculated in step (f) over the value of the minimum standard deviation calculated in one or more previous instances of step (f).

16. The method of claim 13, wherein the profile is obtained using at least one of:

an atomic force microscope (AFM), a near-field scanning optical microscope (NSOM), an NSOM probe operating as an AFM probe, a scanning tunneling microscope (STM), an interferometer, a white light interferometer, a stereo microscope, or a confocal microscope.

17. The method of claim 13 further comprising the step of adding random numbers to the profile points lying outside a region bounded by the edges to increase the standard deviation for straight lines extending beyond at least one of the side surfaces, the random numbers having an offset substantially equal in magnitude to sizes of the at least two side surfaces, and an amplitude of variation larger than fluctuations in the obtained surface profile.

18. The method of claim 13 further comprising the step of:

i) locating additional points on the top surface of the microstructure using the point defined in step (h) on the top surface of the microstructure as a reference point.

\* \* \* \* \*